United States Patent
Wang

(10) Patent No.: US 10,448,168 B2
(45) Date of Patent: Oct. 15, 2019

(54) MEMS MICROPHONE HAVING REDUCED LEAKAGE CURRENT AND METHOD OF MANUFACTURING THE SAME

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Qiang Wang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/818,561

(22) Filed: Nov. 20, 2017

(65) Prior Publication Data
US 2018/0152791 A1  May 31, 2018

(30) Foreign Application Priority Data
Nov. 29, 2016 (CN) .......................... 2016 1 1066968

(51) Int. Cl.
*H04R 9/08* (2006.01)
*B81B 3/00* (2006.01)
(Continued)

(52) U.S. Cl.
CPC ............. *H04R 9/08* (2013.01); *B81B 3/0086* (2013.01); *B81C 1/00698* (2013.01);
(Continued)

(58) Field of Classification Search
CPC ........ H04R 9/08; H04R 19/005; H04R 31/00; H04R 2201/003; B81B 3/0086;
(Continued)

(56) References Cited

U.S. PATENT DOCUMENTS 8,541,852 B2 * 9/2013 Kasai .................... H04R 19/005
                                              257/415
9,319,798 B2 * 4/2016 Okugawa ............. H04R 19/005
(Continued)

OTHER PUBLICATIONS

European Application No. 17203756.6, Extended European Search Report dated Mar. 15, 2018, 7 pages.

*Primary Examiner* — Oyesola C Ojo
(74) *Attorney, Agent, or Firm* — Kilpatrick Townsend & Stockton LLP

(57) ABSTRACT

A microphone includes a substrate, an opening extending through the substrate, a first electrode plate layer on the opening, a second electrode plate layer spaced apart from the first electrode plate layer, a support structure layer on the substrate including an electrode attachment portion operable to attach the second electrode plate layer and a stopper operable to block contact between the first electrode plate layer and the second electrode plate layer, a cavity delineated by the support structure layer, the first electrode plate layer, and the substrate, and a conductive material layer on the support structure layer and spaced apart from the second electrode plate layer. The microphone has a significantly lower leakage current than conventional semiconductor microphones.

20 Claims, 11 Drawing Sheets

(51) Int. Cl.
  *B81C 1/00* (2006.01)
  *H04R 19/00* (2006.01)
  *H04R 31/00* (2006.01)

(52) U.S. Cl.
  CPC ........... *H04R 19/005* (2013.01); *H04R 31/00* (2013.01); *B81B 2201/0257* (2013.01); *B81B 2203/04* (2013.01); *B81C 2201/0109* (2013.01); *H04R 2201/003* (2013.01)

(58) Field of Classification Search
  CPC ........ B81B 2201/0257; B81B 2203/04; B81C 1/00698; B81C 2201/0109
  See application file for complete search history.

(56) References Cited

U.S. PATENT DOCUMENTS

| | | | |
|---|---|---|---|
| 9,338,559 B2* | 5/2016 | Yang | H04R 19/04 |
| 9,420,380 B2* | 8/2016 | Inoue | H04R 19/00 |
| 9,998,843 B2* | 6/2018 | Peng | H04R 31/006 |
| 2006/0280319 A1* | 12/2006 | Wang | B81B 3/0072 381/172 |
| 2007/0154040 A1* | 7/2007 | Chen | H04R 19/04 381/174 |
| 2008/0075308 A1* | 3/2008 | Wei | H04R 19/005 381/175 |
| 2011/0108933 A1* | 5/2011 | Nakatani | B81C 1/00238 257/415 |
| 2015/0264476 A1* | 9/2015 | Uchida | H04R 31/00 381/174 |
| 2016/0088402 A1* | 3/2016 | Hu | H04R 7/20 381/174 |
| 2016/0088414 A1* | 3/2016 | Zheng | H04R 31/00 381/174 |
| 2016/0212542 A1* | 7/2016 | Wang | H04R 19/005 |

* cited by examiner

MEMS MICROPHONE HAVING REDUCED LEAKAGE CURRENT AND METHOD OF MANUFACTURING THE SAME

CROSS-REFERENCES TO RELATED APPLICATIONS

The present application claims priority to Chinese patent application No. 201611066968.X, filed with the State Intellectual Property Office of People's Republic of China on Nov. 29, 2016, the content of which is incorporated herein by reference in its entirety.

FIELD OF INVENTION

The present invention relates to semiconductor technology, and more particularly to a microphone having reduced leakage current and a method for manufacturing the same.

BACKGROUND OF THE INVENTION

With the development of semiconductor technology, electronic products presently are increasingly tending to miniaturization with a light, thin, and compact design. In the field of electro-acoustic products, the microphone is a sensor that converts acoustic energy into electrical energy. A capacitive micro-electro-mechanical system (MEMS) microphone generally includes a vibration membrane (lower electrode) fixedly formed on a substrate and facing an opening disposed on a backside of the substrate, and a fixed plate (upper electrode) being suspended above the vibration membrane, and a cavity between the vibration membrane and the fixed plate. A capacitive MEMS microphone enables detection of a capacitive value change due to the displacement of the vibration membrane caused by a change in the acoustic pressure, and the detected capacitive value change is then converted to an electrical signal for processing.

A leakage current of a MEMS microphone can be measured by applying a voltage across the lower electrode and the upper electrode. Referring to FIG. 1, a voltage is applied between a first electrode plate (vibration membrane of the microphone) 101 and a second electrode plate (fixed plate) 102 of the capacitor to measure a leakage current. The smallest the leakage current, the better the insulation between the two plates, and the better the performance of the microphone.

BRIEF SUMMARY OF THE INVENTION

The present inventor has discovered that a charge is present on the electrode plates of a microphone leading a large leakage current of the capacitor and poor performance of the microphone and provides herein a novel structure of a microphone and a method for manufacturing the same.

According to embodiments of the present invention, a microphone may include a substrate, an opening extending through the substrate, a first electrode plate layer over the opening, a second electrode plate layer spaced apart from the first electrode plate layer, a support structure layer on the substrate including an electrode attachment portion operable to attach the second electrode plate layer and a stopper operable to block contact between the first electrode plate layer and the second electrode plate layer, a cavity delineated by the support structure layer, the first electrode plate layer, and the substrate, and a conductive material layer on the support structure layer and spaced apart from the second electrode plate layer.

In one embodiment, the conductive material layer includes polysilicon, gold, or platinum.

In one embodiment, the stopper includes a first portion connected to the electrode attachment portion and a second portion disposed below the first portion and protruding from the second electrode plate layer, the conductive material layer is on the second portion of the stopper.

In one embodiment, the conductive material layer is disposed on a lower surface of the first portion of the stopper.

In one embodiment, the second portion of the stopper has a width smaller than a width of the first portion of the stopper. In one embodiment, the width of the first portion of the stopper is in a range between 2 μm and 4 μm, and the width of the second portion of the stopper is in a range between 1 μm and 2 μm.

In one embodiment, the second electrode plate layer is disposed on a surface of the electrode attachment portion facing the first electrode plate layer.

In one embodiment, the microphone may further include a first through hole extending through the second electrode plate layer, a second through hole extending through the support structure layer and aligned with the first through hole, the first and second through holes collectively form a through hole extending through the second electrode plate layer and the support structure layer to the cavity.

In one embodiment, the substrate includes silicon, the first electrode plate layer and the second electrode plate layer each include polysilicon, and the support structure layer includes silicon nitride.

In one embodiment, the support structure layer includes a third through hole exposing a surface of the first electrode plate layer and a fourth through hole exposing a surface of the second electrode plate layer.

In one embodiment, the microphone further include a first connection member in the third through hole and in contact with the first electrode plate layer, and a second connection member in the fourth through hole and in contact with the second electrode plate layer.

In one embodiment, the first electrode plate layer includes a protrusion portion protruding toward the substrate.

Embodiments of the present invention also provide a method for manufacturing a microphone. The method may include providing a semiconductor structure including a substrate, a first sacrificial layer on the substrate, a first electrode plate layer on the first sacrificial layer, a second sacrificial layer on the first electrode plate layer, a first recess in the second sacrificial layer; and forming a patterned second electrode plate layer on the second sacrificial layer; forming a conductive material layer in the first recess, the conductive material layer and the second electrode plate layer being spaced apart from each other. The method may also include forming a patterned support structure layer on the semiconductor structure, the support structure layer having an electrode attachment portion operable to attach the second electrode plate layer and a stopper operable to block contact between the first electrode plate layer and the second electrode plate layer, the stopper having a portion formed on the conductive material layer; etching the substrate to form an opening exposing a portion of a lower surface of the first sacrificial layer; removing the second sacrificial layer to formed a cavity, the cavity being delineated by the support structure layer, the first electrode plate layer, and the substrate; and removing a portion of the first sacrificial layer.

In one embodiment, the conductive material layer comprises polysilicon, gold, or platinum. In one embodiment, the stopper includes a first portion connected to the electrode attachment portion and a second portion disposed below the first portion and protruding from the second electrode plate layer, the conductive material layer is on the second portion of the stopper. In one embodiment, the conductive material layer is disposed on a lower surface of the first portion of the stopper.

In one embodiment, the second portion of the stopper has a width smaller than a width of the first portion of the stopper. In one embodiment, the width of the first portion of the stopper is in a range between 2 μm and 4 μm, and the width of the second portion of the stopper is in a range between 1 μm and 2 μm.

In one embodiment, the second electrode plate layer and the conductive material layer are made of a same material. Forming the second electrode plate layer and the conductive material layer may include forming an electrically conductive cover layer on the second sacrificial layer, the cover layer having a portion formed in the first recess; patterning the cover layer, wherein a portion of the covering layer on the second sacrificial layer is operable as the second electrode plate layer, the portion of the cover layer formed in the first recess is operable as the conductive material layer, and the conductive material layer and the second electrode plate layer are spaced apart from each other.

In one embodiment, forming the patterned second electrode plate layer includes forming a first through hole extending through the second electrode plate layer; forming the support structure layer includes forming a second through hole extending through the support structure layer and aligned with the first through hole. The first and second through holes collectively form a through hole extending through the second electrode plate layer and the support structure layer to the cavity.

In one embodiment, forming the support structure layer further includes forming a third through hole exposing a surface of the first electrode plate layer and a fourth through hole exposing a surface of the second electrode plate layer. Prior to forming the opening, the method further includes forming a first connection member in the third through hole and in contact with the first electrode plate layer, and forming a second connection member in the fourth through hole and in contact with the second electrode plate layer.

In one embodiment, providing the semiconductor structure includes providing a substrate, forming the first sacrificial layer on the substrate, forming the first electrode plate layer on the first sacrificial layer, forming the second sacrificial layer on the first electrode plate layer, and patterning the second sacrificial layer to form the first recess. In one embodiment, forming the first electrode plate layer includes forming a protrusion portion protruding toward the substrate.

In one embodiment, forming the first sacrificial layer on the substrate includes forming a first portion of the first sacrificial layer, patterning the first portion of the sacrificial layer to form a second recess exposing a surface of the substrate, forming a second portion of the first sacrificial layer on the first portion of the sacrificial layer, the second portion of the first sacrificial layer having a portion disposed in the second recess such that the portion of the second portion of the first sacrificial layer disposed in the second recess forms a third recess, and performing an etch process on the second portion of the first sacrificial layer and on the first portion of the first sacrificial layer to form a plurality of fourth recesses spaced apart from each other and exposing a surface of the substrate. In a subsequent process of forming the first electrode plate layer, a portion of the first electrode plate layer is formed in the third recess such that the first electrode plate layer comprises a protrusion portion protruding toward the substrate.

In one embodiment, forming the second sacrificial layer includes forming a third portion of the second sacrificial layer on the first electrode plate layer, patterning the third portion of the second sacrificial layer to form a fifth recess exposing a surface of the first electrode plate layer, and forming a fourth portion on the third portion of the second sacrificial layer, the fourth portion having a portion formed in the fifth recess such that the portion formed in the fifth recess is the first recess.

In one embodiment, forming the second sacrificial layer further includes forming a fifth portion of the second sacrificial layer on the fourth portion of the second sacrificial layer; the fifth portion having a portion formed on a bottom and sidewalls of the first recess. The second electrode plate layer and the conductive material layer are formed on the fifth portion of the second sacrificial layer.

In one embodiment, the method may further include, prior to forming the support structure layer, forming a spacer on sidewalls of the second electrode plate layer.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
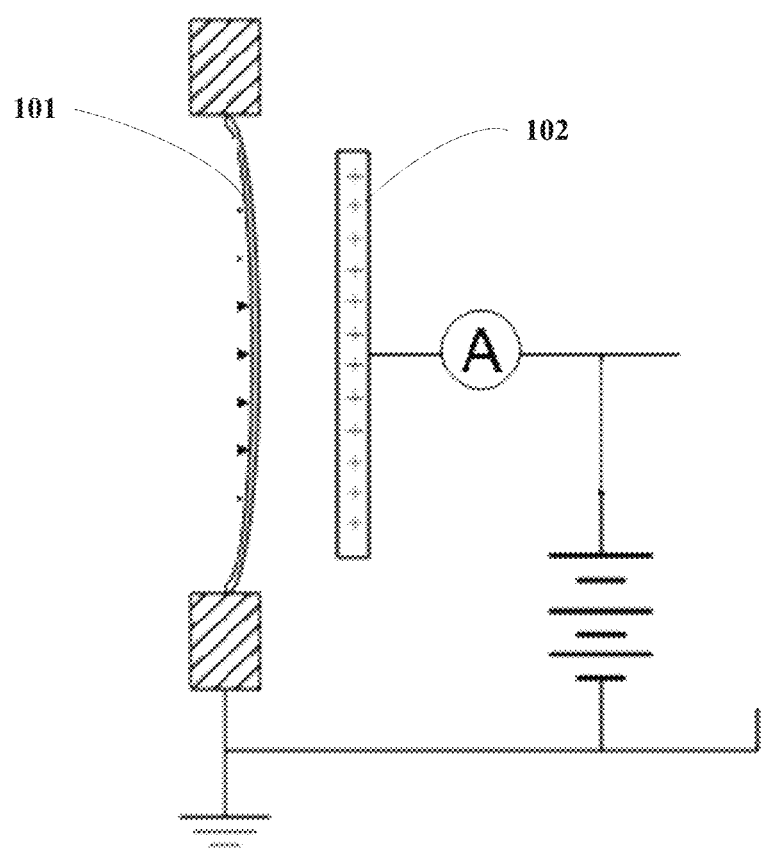
FIG. 1 is a schematic diagram illustrating a circuit for measuring a leakage current of a MEMS microphone that can be used in embodiments of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the invention are described herein with reference to cross-section illustrations that are schematic illustrations of idealized embodiments (and intermediate structures) of the invention.

It should be noted that like reference numerals are used to denote like elements, and once an element has been defined in a drawings, it will not be further described in other drawings.

The present inventor has discovered that a charge (e.g., electrostatic charge) is present on the electrode plate of a microphone, resulting in a larger capacitive leakage current and poor performance of the microphone. Accordingly, the present inventor provides a novel solution to reduce the charge on the electrode plate of a microphone.

Figure 2:
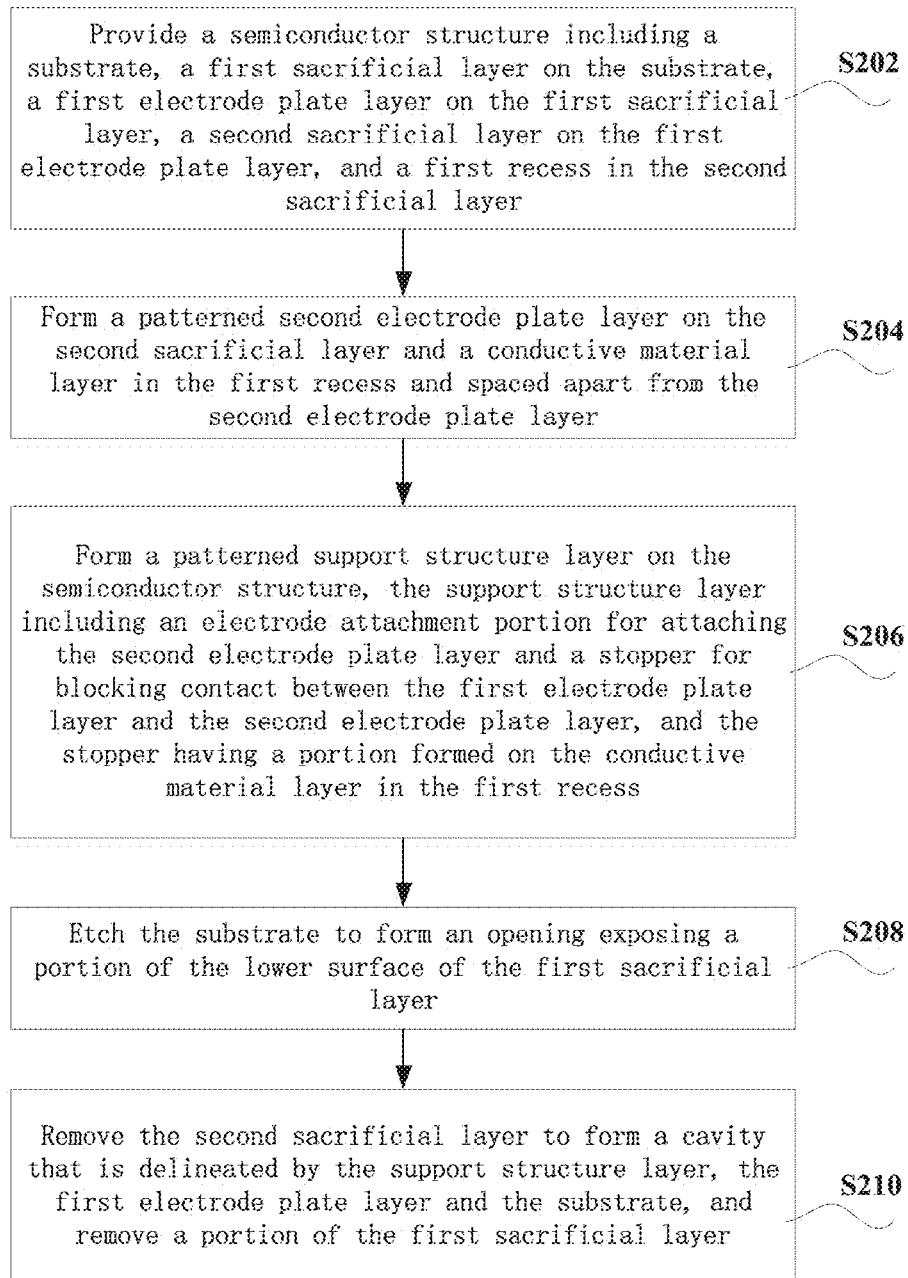
FIG. 2 is a flowchart illustrating a method for manufacturing a microphone according to an embodiment of the present invention.

FIG. 2 is a flowchart illustrating a method for manufacturing a microphone according to an embodiment of the present invention. FIGS. 3A to 3G are cross-sectional views illustrating intermediate stages of a microphone in a manufacturing method according to an embodiment of the present invention. The manufacturing process of a microphone according to an embodiment of the present invention will be described in detail below with reference to FIG. 2 and FIGS. 3A to 3G.

Referring to FIG. 2, in step S202, a semiconductor structure is provided. The semiconductor structure includes a substrate, a first sacrificial layer on the substrate, a first electrode plate layer on the first sacrificial layer, a second sacrificial layer on the first electrode plate layer, and a first recess in the second sacrificial layer.

Figure 3A:
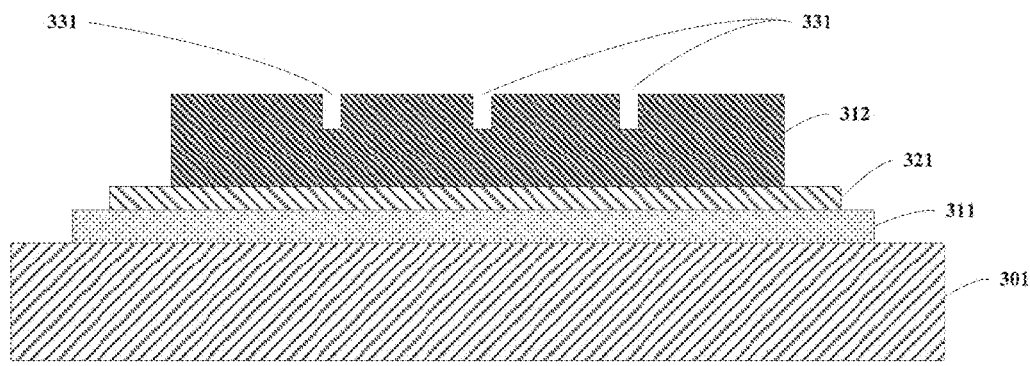
FIGS. 3A to 3G are cross-sectional views illustrating intermediate stages of a microphone in a manufacturing method according to an embodiment of the present invention.

FIG. 3A is a cross-sectional view illustrating an intermediate stage of a microphone in a manufacturing step of S202. Referring to FIG. 3A, the semiconductor structure may include a substrate 301, a first sacrificial layer 311 on the substrate, a first electrode plate layer 321 on the first sacrificial layer, a second sacrificial layer 312 on the first electrode plate layer, and a first recess 331 formed in the second sacrificial layer. Substrate 301 may include silicon. First sacrificial layer 311 may include silicon dioxide. First electrode plate layer 321 may include polysilicon. Second sacrificial layer 312 may include silicon dioxide. The forming of the semiconductor structure will be described in detail later below.

Referring back to FIG. 2, in step S204, a patterned second electrode plate layer is formed on the second sacrificial layer, and a conductive material layer is formed in the first recess and spaced apart from the second electrode plate layer.

Figure 3B:
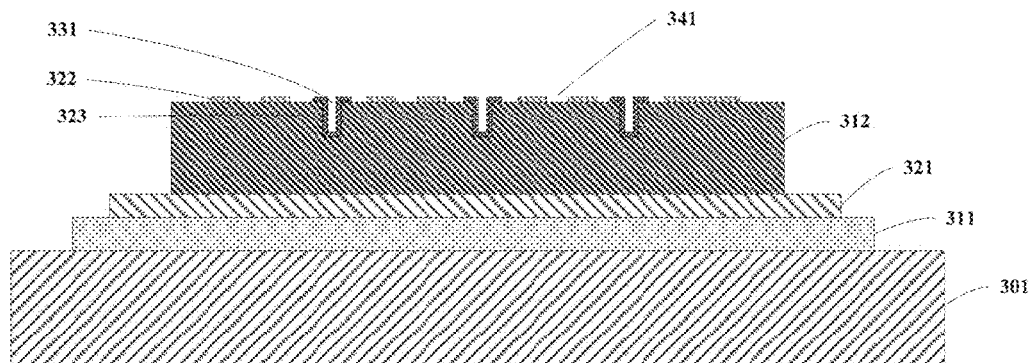

FIG. 3B is a cross-sectional view illustrating an intermediate stage of a microphone in a manufacturing step S204. Referring to FIG. 3B, a patterned second electrode plate layer 322 is formed on second sacrificial layer 312, and a conductive material layer 323 is formed in first recess 331. Conductive material layer 323 is spaced apart from second electrode plate layer 322. Second electrode plate layer 322 may include polysilicon. Conductive material layer 323 may include polysilicon, gold or platinum. It will be appreciated by those of skill in the art that the conductive material layer may include other acid-insoluble metal materials. In one embodiment, the conductive material layer may be formed on the bottom and sidewalls of the first recess. In another embodiment, the conductive material layer may be formed extending to the upper surface of second sacrificial layer 312, as shown in FIG. 3B.

In one embodiment, second electrode plate layer 322 and conductive material layer 323 may be formed of the same material. In one embodiment, forming the second electrode plate layer and forming the conductive material layer may include forming (e.g., using a deposition process) an electrically conductive cover layer on second sacrificial layer 312, the cover layer having a portion formed in the first recess. In one embodiment, forming the second electrode plate layer and forming the conductive material layer may also include patterning the cover layer, wherein a portion of the cover layer on the second sacrificial layer is operable as the second electrode plate layer, and the portion of the cover layer formed in the first recess is operable as the conductive material layer. The conductive material layer (i.e., the portion of the cover layer in the first recess) and the second electrode plate layer (i.e., the portion of the cover layer on the upper surface of the second sacrificial layer) are spaced apart from each other. Compared with conventional techniques, embodiments of the present invention do not have an increase in the number of masks, thus, embodiments of the present invention do not increase the manufacturing costs, thus facilitate mass production.

Figure 6:
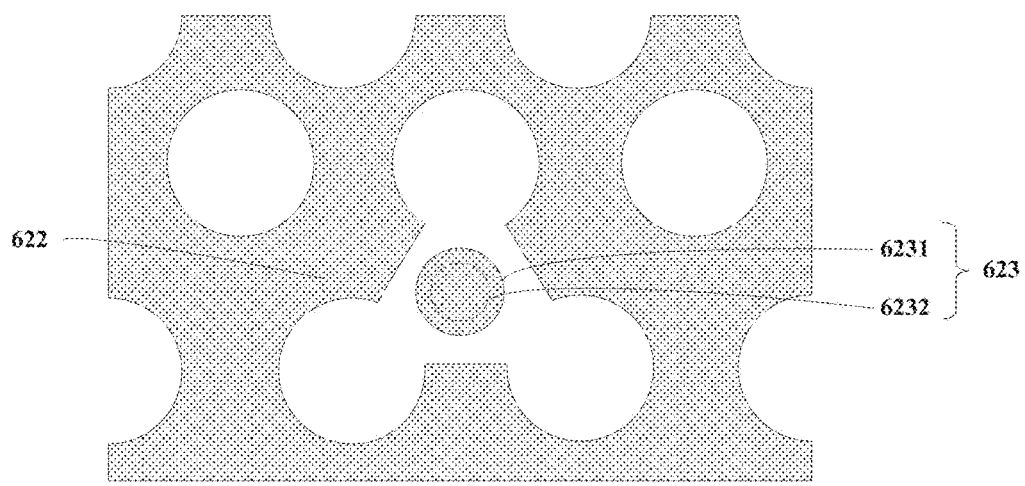
FIG. 6 is a schematic diagram illustrating a portion of a reticle used in a lithography process according to an embodiment of the present invention.

In one embodiment, the patterning of the cover layer may be performing by photolithography and etching processes using the reticle shown in FIG. 6. After forming the cover layer, a portion of the cover layer not covered by the reticle shown in FIG. 6 is removed by etching, and the remaining cover layer covered by the reticle forms the second electrode plate layer and the conductive material layer. A portion 622 of the reticle is used to form second electrode plate layer 322, another portion 623 of the reticle is used to form patterned conductive layer 323. First portion 6231 of portion 623 is used to pattern the portion of conductive material layer 323 that is epitaxially formed on second sacrificial layer 312, and a second portion 6232 of portion 623 is used to pattern conductive material layer 323 to obtain the portion of conductive material layer 323 in the first recess. It should be noted that the dotted line in FIG. 6 is for convenience of illustration only and is not actual present in the reticle.

In another embodiment, second electrode plate layer 322 and conductive material layer 323 may be of different materials. In another embodiment, forming the second electrode plate layer and forming the conductive material layer may include separately forming a patterned second electrode plate layer 322 and forming a conductive material layer 323 on second sacrificial layer 312.

In one embodiment, referring to FIG. 3B, in the step of forming patterned second electrode plate layer 322 on second sacrificial layer 312, a through hole 341 is formed extending through second electrode plate layer 322. Through hole 341 exposes a portion of the upper surface of second sacrificial layer 312.

Referring back to FIG. 2, in step S206, a patterned support structure layer is formed on the semiconductor structure that includes the formed second electrode plate layer and the conductive material layer. The support structure layer includes an electrode attachment portion for attaching the second electrode plate layer and a stopper for blocking the contact between the first electrode plate layer and the second electrode plate layer. A portion of the stopper is formed on the conductive material layer in the first recess.

Figure 3C:
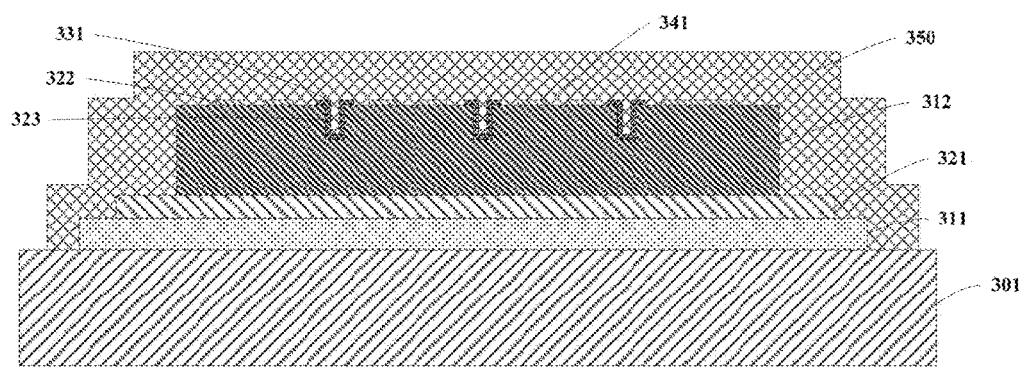
Figure 3D:
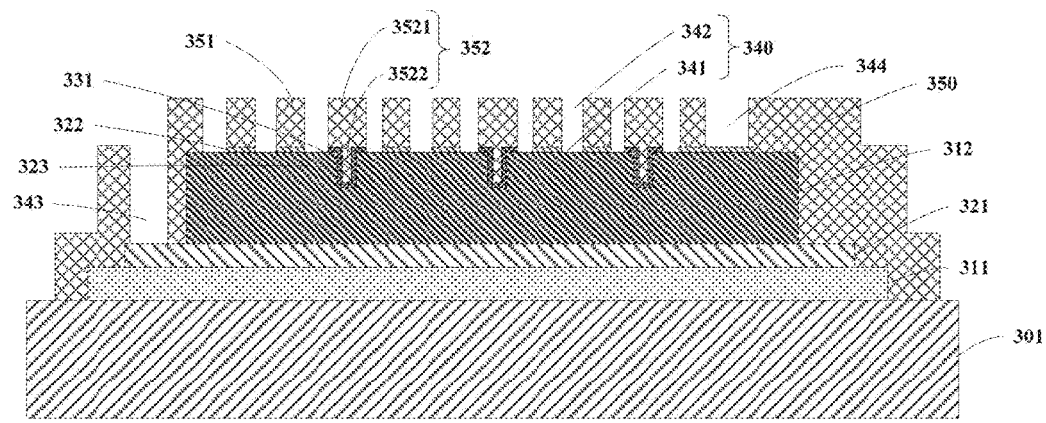

FIG. 3D is a cross-sectional view illustrating an intermediate stage of a microphone in a manufacturing step S206. Referring to FIG. 3D, a patterned support structure layer 350 is formed on the semiconductor structure after the formation of second electrode plate layer 322 and conductive material layer 323. Support structure layer 350 may include an electrode attachment portion 351 for attaching second electrode plate layer 322 and a stopper 352 for blocking contact between first electrode plate layer 321 and second electrode plate layer 322. A portion of stopper 352 is formed on conductive material layer 323 in first recess 331. Support structure layer 350 may include silicon nitride.

In one embodiment, referring to FIG. 3D, stopper 352 may include a first portion 3521 connected to electrode attachment portion 351 and a second portion 3522 disposed below first portion 3521. Second portion 3522 protrudes from second electrode plate layer 322. Conductive material layer 323 may be disposed on second portion 3522. For example, the conductive material layer may be disposed on a lower surface of the first portion of the stopper.

It should be noted that, although first portion 3521 of the stopper is not shown as being connected to electrode attachment portion 351 in the cross-sectional view of the structure shown in FIG. 3D, it is understood by those of skill in the art that, first portion 3521 and electrode attachment portion 351 may be connected to each other.

In one embodiment, referring to FIG. 3D, the lateral width of second portion 322 is smaller than the lateral width of first portion 3521. For example, the lateral width of first portion 3521 may range from 2 µm (microns) to 4 µm, e.g., 3 µm. The lateral width of second portion 3522 may range from 1 µm to 2 µm, e.g., 1.5 µm.

In one embodiment, in the step of forming the support structure layer, as shown in FIG. 3D, support structure layer 350 is formed having a second through hole 342 extending through the support structure layer and aligned with first through hole 341. First through hole 341 and second through hole 342 form collectively a through hole 340 that extends through second electrode plate layer 322, through support structure layer 350, and to second sacrificial layer 312.

It is to be noted that the first through hole and the second through hole in the drawings are merely illustrative. In some embodiments, the lateral width (or diameter) of the second through hole (e.g., second through hole 342) is larger than the first through hole (first through hole 341), which is advantageous to overcome manufacturing process variations.

In one embodiment, in the step of forming the support structure layer, a third through hole 343 may be formed in support structure layer 350 exposing a surface of first electrode plate layer 321 and a fourth through hole 344 may be formed in support structure layer 350 exposing a surface of second electrode plate layer 322.

The process of forming the support structure layer will be described with reference to FIGS. 3C and 3D. In one embodiment, the step of forming the support structure layer may include forming (e.g., using a deposition process) support structure layer 350 on the structure shown in FIG. 3B, as shown in FIG. 3C. In one embodiment, the step of forming the support structure layer may also include performing an etch process on support structure layer 350 to obtain the structure shown in FIG. 3D.

Referring back to FIG. 2, in step S208, the substrate is etched to form an opening that exposes a portion of the lower surface of the first sacrificial layer.

Figure 3E:
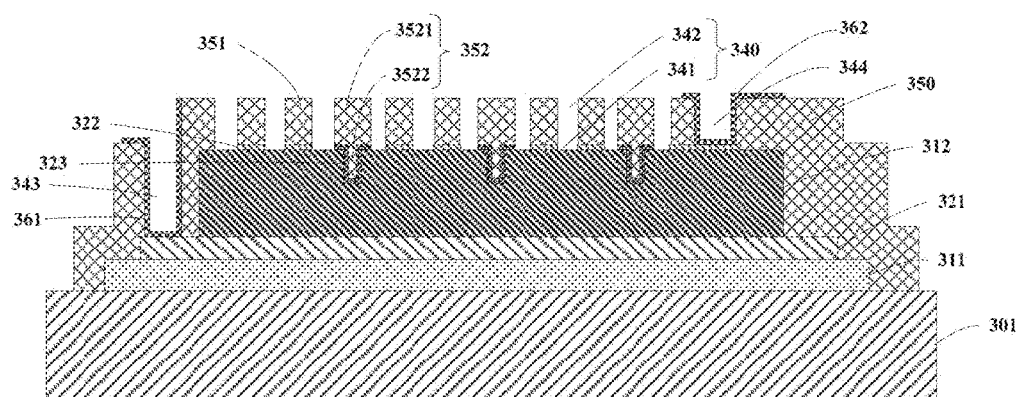
Figure 3F:
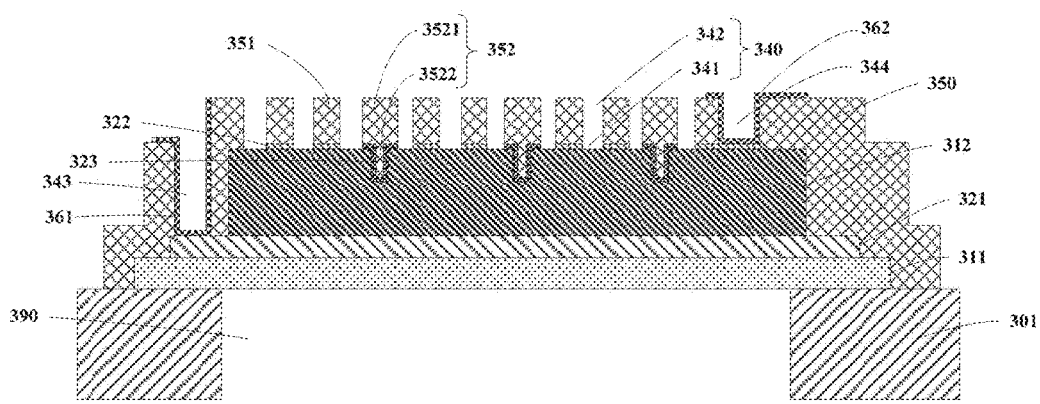

FIG. 3F is a cross-sectional view illustrating an intermediate stage of a microphone in manufacturing step S208.

Referring to FIG. 3F, substrate 301 is etched to form an opening 390 that exposes a portion of the lower surface of first sacrificial layer 311.

In one embodiment, referring to FIG. 3E, prior to performing the etch process on the substrate to form an opening, the manufacturing method may further include forming a first connection member 361 in third through hole 343 in contact with first electrode plate layer 321, and a second connection member 362 in fourth through hole 344 in contact with second electrode plate layer 322. Next, the substrate is etched to formed an opening to form the structure shown in FIG. 3F. In one embodiment, as shown in FIG. 3E, first connection member 361 is formed on the bottom and sidewalls of third through hole 343 and extends to the upper surface of support structure layer 350. In one embodiment, as shown in FIG. 3E, a second connection member 362 is formed on the bottom and sidewalls of fourth through hole 344 and extends to the upper surface of support structure layer 350. The first connection member and the second connection member each may include a metal material, e.g., copper or tungsten.

Referring back to FIG. 2, in step S210, the second sacrificial layer is removed to form a cavity that is delineated by the support structure layer, the first electrode plate layer, and the substrate. A portion of the first sacrificial layer is also removed at the same with the removal of the second sacrificial layer.

Figure 3G:
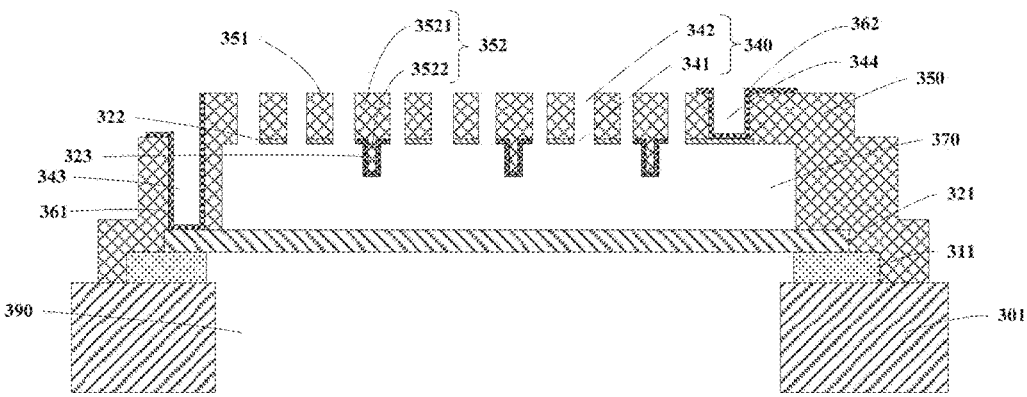

FIG. 3G a cross-sectional view illustrating an intermediate stage of a microphone in manufacturing step S210. Referring to FIG. 3G, second sacrificial layer 312 is removed, e.g., using a buffered oxide etch (BOE) process to form a cavity 370 that is delineated by support structure layer 350, first electrode plate layer 321, and substrate 301. A portion of first sacrificial layer 311 is also removed. For example, second sacrificial layer 312 may be removed by injecting hydrofluoric acid as an etchant through hole 340 to form cavity 370, and a portion of first sacrificial layer 311 may be removed by injecting hydrofluoric acid as an etchant through opening 390. In one embodiment, the second sacrificial layer and a portion of the first sacrificial layer may be removed in a same etch process.

A method for manufacturing a microphone according to an embodiment of the present invention has been described.

In one embodiment, prior to forming the support structure layer, the manufacturing method may further include forming a spacer on side surfaces of the second electrode plate layer.

Using the above-described manufacturing method, a microphone according to an embodiment of the present invention is thus formed. Referring to FIG. 3G, the microphone may include a substrate 301, and an opening 390 extending through substrate 301. The substrate may include silicon. The microphone may also include a first electrode plate layer (e.g., the first electrode plate layer may be a vibrating membrane) 321 on substrate 301 covering opening 390. The first electrode plate layer may include polysilicon. The microphone may also include a support structure layer 350 on substrate 301. Support structure layer 350 may include an electrode attachment portion 351 operable to attach a second electrode plate layer 322 and a stopper 352 operable to block contact between first electrode plate layer 321 and second electrode plate layer 322. Support structure layer 350, first electrode plate layer 321, and substrate 301 collectively form a cavity 370 operable as a vibration chamber 370. The microphone may also include a conductive material layer 323 on the surface of stopper 352 in the vicinity of first electrode plate layer 321. Conductive material layer 323 and first electrode plate layer 321 are spaced apart from each other. The conductive material layer may include polysilicon, gold, or platinum. In one embodiment, the microphone may also include a second electrode plate layer 322 disposed on the surface of electrode attachment portion 351 in the vicinity of first electrode plate layer 321. The second electrode plate layer may include polysilicon.

In the embodiment, the stopper is disposed in the microphone to prevent the first electrode plate layer (i.e., the vibrating membrane) from coming into contact with the second electrode plate layer during the vibration of the first electrode plate layer for protecting the first electrode plate layer. Since the conductive material layer is formed on the surface of stopper, when the first electrode plate layer is stopped by the stopper during the vibration of the first electrode plate layer, and the charge on the first electrode plate layer will be collected on the conductive material layer on the stopper. When the first electrode plate layer is separated from the stopper, charge collected on the conductive material layer is released due to the principle of tip discharge so that the charge on the electrode plate of the microphone capacitor can be reduced and the leakage current can be reduced to improve the device performance.

Ignoring effects of the gravity, when a voltage is applying to the microphone of the present invention, the first electrode plate layer and the second electrode plate layer of the microphone capacitor are deformed by the action of an electric field. When the voltage between the two electrode plate layers reaches the pull-in voltage (e.g., the pull-in voltage is 18 V), the first electrode plate layer is then pulled against the stopper. In general, the leakage current is measured with a voltage (e.g., 20 V) applying to the two electrode plate layers that is greater than the pull-in voltage. The present inventor has found that the leakage current of the microphone of the present invention is significantly lower than those of conventional microphones, e.g., the leakage current is reduced to 30% to 66% of those of conventional microphones so that the performance and yield of the microphone are greatly improved.

In one embodiment, referring to FIG. 3G, stopper 352 may include a first portion 3521 connected to electrode attachment portion 351 (not shown) and a second portion 3522 disposed below first portion 3521. Second portion 3522 protrudes from second electrode plate layer 322. Conductive material layer 323 is disposed on second portion 3522. For example, conductive material layer 323 may be disposed on the surface of second portion 3522 and on the lower surface of first portion 3521.

In one embodiment, referring to FIG. 3G, the lateral width of second portion 3522 is smaller than the lateral width of first portion 3521. This facilitates the implantation of tip charge collection and discharge. In one example embodiment, the width of first portion 3521 may be in the range between 2 μm (microns) and 4 μm, e.g., 3 μm. The width of second portion 3522 may be in the range between 1 μm and 2 μm, e.g., 1.5 μm.

In one embodiment, as shown in FIG. 3G, second electrode plate layer 322 is formed having a first through hole 341 extending through the second electrode plate layer. In one embodiment, support structure layer 350 is formed with a second through hole 342 extending through the support structure layer and aligned with first through hole 341. First through hole 341 and second through hole 342 collectively form a through hole 340 that extends through second electrode plate layer 322, through support structure layer 350, and to cavity 370. Through hole 340 is operable as a sound hole of the microphone.

In one embodiment, still referring to FIG. 3G, support structure layer 350 is formed with a third through hole 343 exposing first electrode plate layer 321 and a fourth through hole 344 exposing second electrode plate layer 322.

In one embodiment, still referring to FIG. 3G, the microphone may further include a first connection member 361 disposed in third through hole 343 and in contact with first electrode plate layer 321, and a second connection member 362 disposed in fourth through hole 344 and in contact with second electrode plate layer 322. In one embodiment, referring to FIG. 3G, first connection member 361 is formed on the bottom and sidewalls of third through hole 343 and extends to the upper surface of support structure layer 350. In one embodiment, referring to FIG. 3G, second connection member 362 is formed on the bottom and sidewalls of fourth through hole 344 and extends to the upper surface of support structure layer 350. First connection member 361 and second connection member 362 each may include a metal material, e.g., copper or tungsten.

In one embodiment, still referring to FIG. 3G, the microphone may further include a first sacrificial layer 311 disposed between substrate 301 and first electrode plate layer 321. The first sacrificial layer may include silicon dioxide.

Figure 4A:
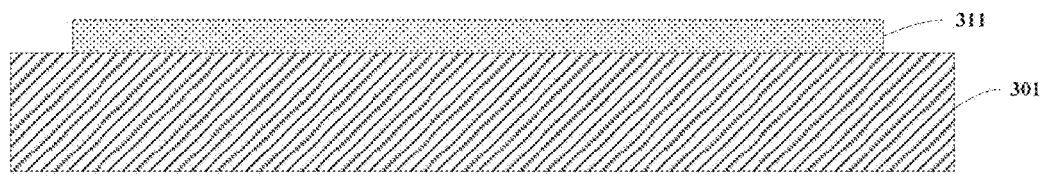
FIGS. 4A to 4C are cross-sectional views illustrating intermediate stages of a semiconductor structure of FIG. 3A according to an embodiment of the present invention.
Figure 4B:
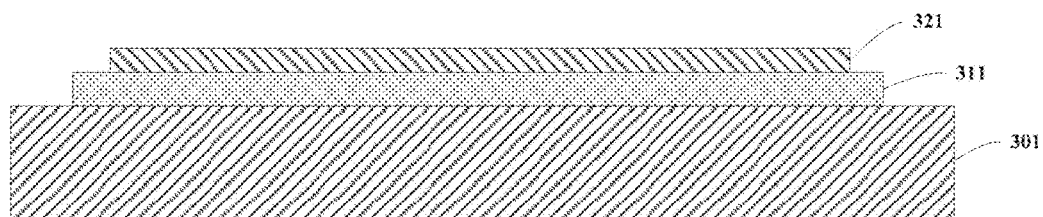
Figure 4C:
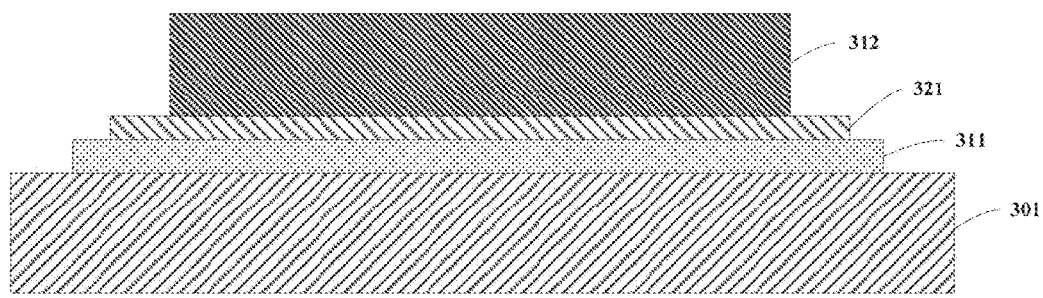

FIGS. 4A to 4C are cross-sectional views illustrating intermediate stages of a semiconductor structure shown in FIG. 3A according to one embodiment of the present invention. The process of forming a semiconductor structure will be described in detail with reference to FIGS. 4A to 4C and FIG. 3A. The semiconductor structure may be provided with the following steps.

Referring to FIG. 4A, a substrate 301 is provided. Substrate 301 may be a silicon substrate.

Next, a patterned first sacrificial layer 311 is formed on substrate 301. For example, a first sacrificial layer 311 is formed, e.g., using a deposition process, on substrate 301, and then first sacrificial layer 311 is etched to form first sacrificial layer 311, as shown in FIG. 4A.

Next, referring to FIG. 4B, a patterned first electrode plate layer 321 is formed on first sacrificial layer 311. For example, a first electrode plate layer is first formed, e.g., using a deposition process, on the structure shown in FIG. 4A, and then the first electrode plate layer is etched to form patterned first electrode plate layer 321.

Next, referring to FIG. 4C, a second sacrificial layer 312 is formed, e.g., using a deposition process, on the first electrode plate layer 321.

Next, referring to FIG. 3A, second sacrificial layer 312 is patterned, e.g., using a photolithography and etching process, to form a first recess 331. The process of manufacturing the semiconductor structure of FIG. 3A is thus described.

In one embodiment, in the step of forming the first electrode plate layer, the first electrode plate layer is formed having a protrusion portion protruding toward the substrate.

In one embodiment, the first sacrificial layer may include a first portion on the substrate and a second portion on the first portion of the first sacrificial layer. In one embodiment, the step of forming a patterned first sacrificial layer on the substrate may include forming the first portion of the first sacrificial layer on the substrate. In one embodiment, the step may further include patterning the first portion of the first sacrificial layer to form a second recess exposing the substrate. In one embodiment, the step may also include forming the second portion of the first sacrificial layer on the first portion of the first sacrificial layer, wherein a portion of the second portion of the first sacrificial layer is formed in the second recess such that the second portion of the first sacrificial layer is formed with a third recess. In one embodiment, the step may also include etching the second portion of the first sacrificial layer to form a plurality of fourth recesses that are spaced apart and expose a portion of the substrate. In the subsequent step of forming the first electrode plate layer, a portion of the first electrode plate layer is formed in the third recess so that the first electrode plate layer has a protrusion portion protruding toward the substrate.

In one embodiment, the second sacrificial layer may include a third portion of the second sacrificial layer on the first electrode plate layer and a fourth portion of the second sacrificial layer on the third portion of the second sacrificial layer. In one embodiment, the step of forming the second sacrificial layer may include forming a third portion of the second sacrificial layer on the first electrode plate layer. In one embodiment, the step may also include patterning the third portion of the second sacrificial layer to form a fifth recess exposing the first electrode plate layer. In one embodiment, the step may also include forming a fourth portion of the second sacrificial layer on the third portion of the second sacrificial layer, the portion of the fourth portion of the second sacrificial layer being formed in the fifth recess such that the fourth portion of the second sacrificial layer includes the first recess.

In one embodiment, the second sacrificial layer may include a fifth portion of the second sacrificial layer on the surface of the fourth portion of the second sacrificial layer. In one embodiment, the step of forming the second sacrificial layer may further include forming the fifth portion of the second sacrificial layer on the surface of the fourth portion of the second sacrificial layer, a portion of the fifth portion of the second sacrificial layer is formed on the bottom and side surfaces of the first recess. In the step of forming the second electrode plate layer and the conductive material layer, the second electrode plate layer and the conductive material layer are formed on the fifth portion of the second sacrificial layer.

Figure 5A:
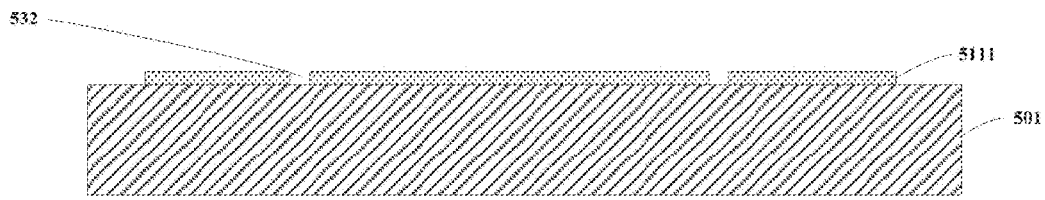
FIGS. 5A to 5O are cross-sectional views illustrating intermediate stages of a microphone in a manufacturing method according to another embodiment of the present invention.
Figure 5B:
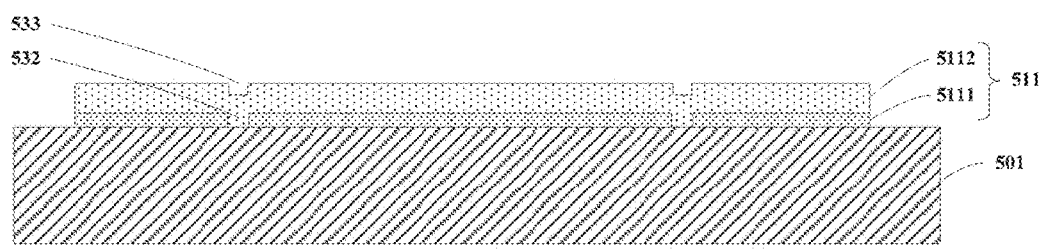
Figure 5C:
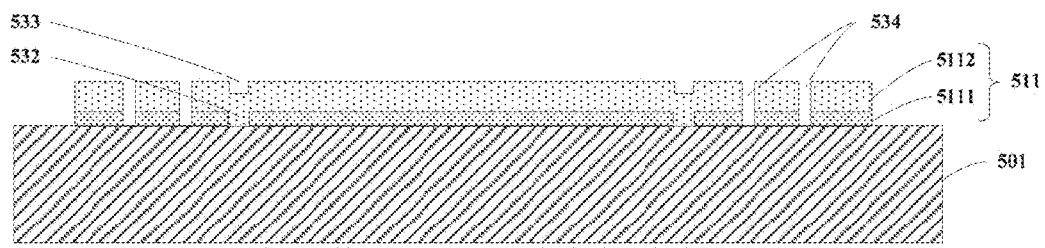
Figure 5D:
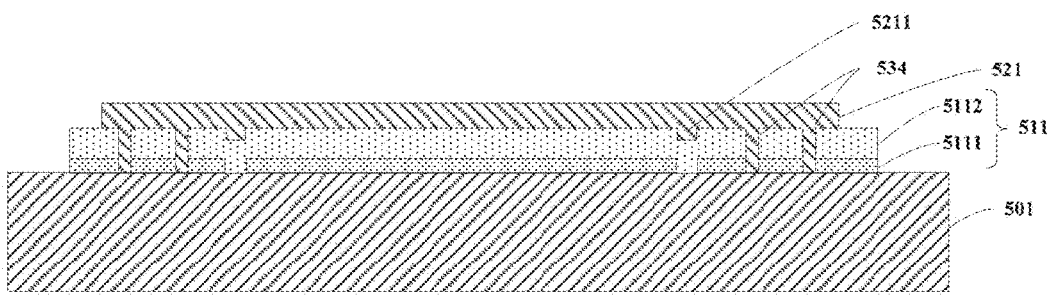
Figure 5E:
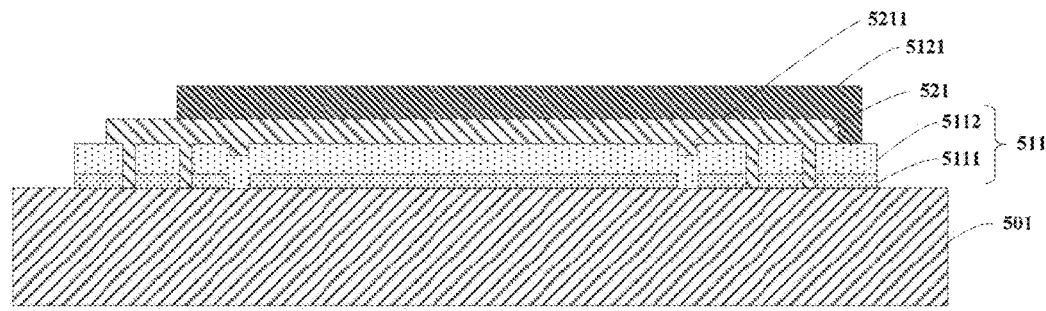
Figure 5F:
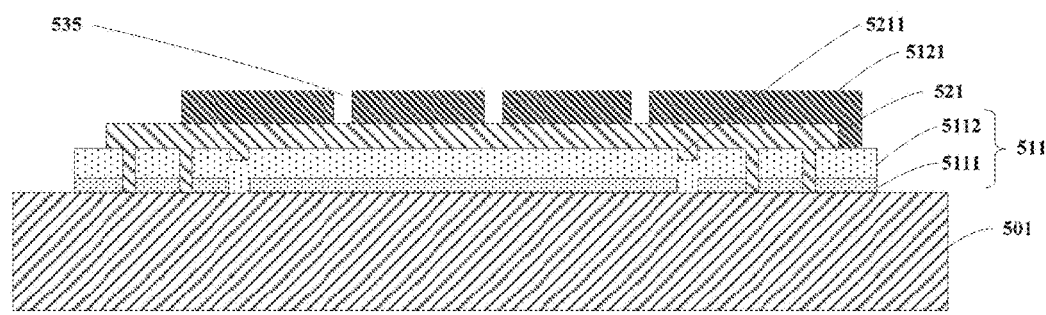
Figure 5G:
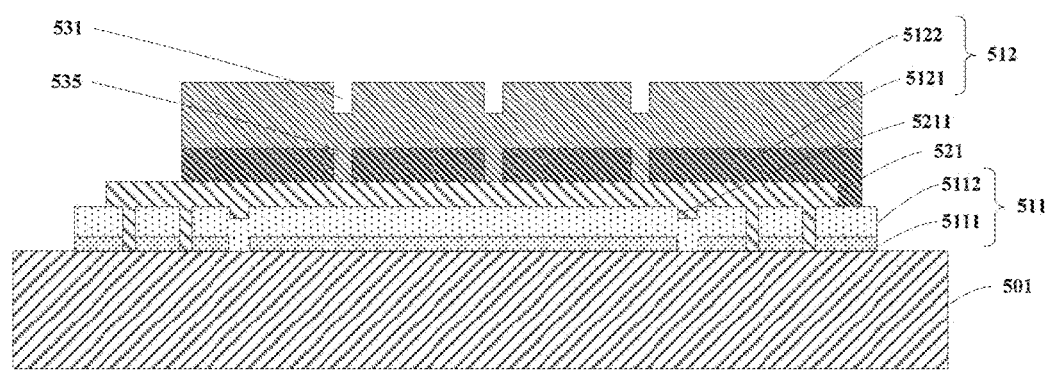
Figure 5H:
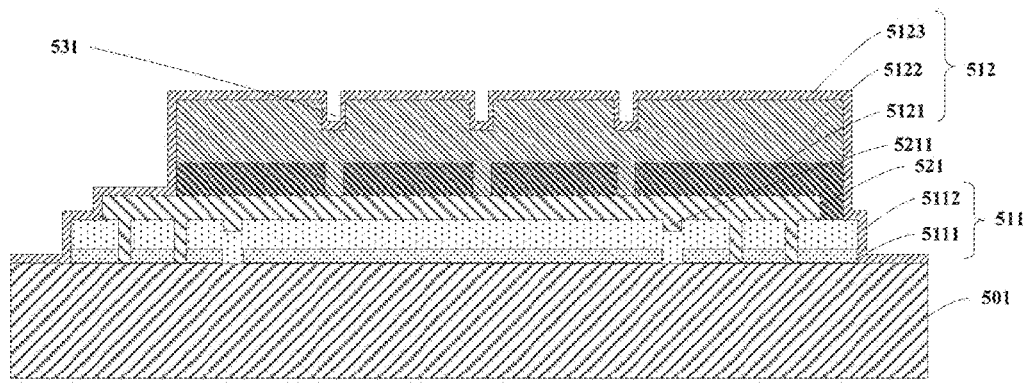
Figure 5I:
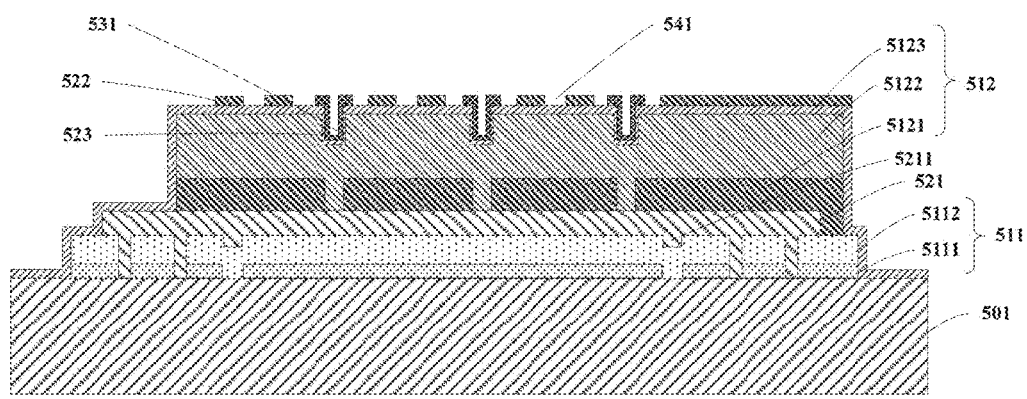
Figure 5J:
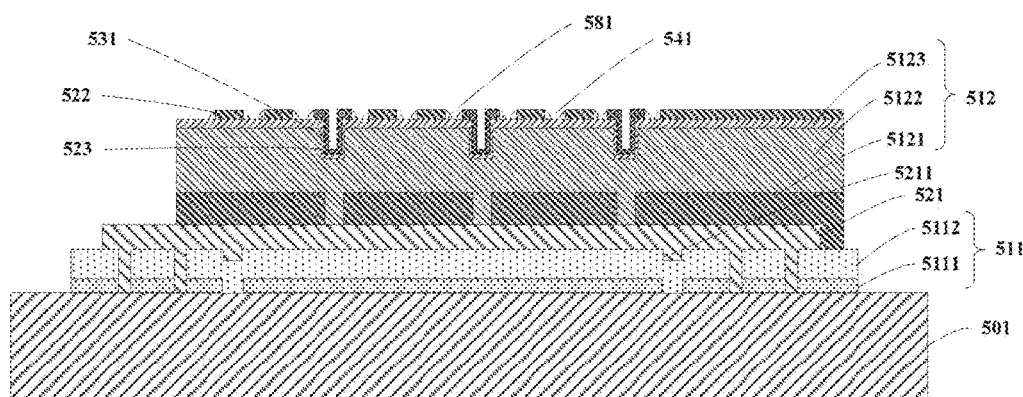
Figure 5K:
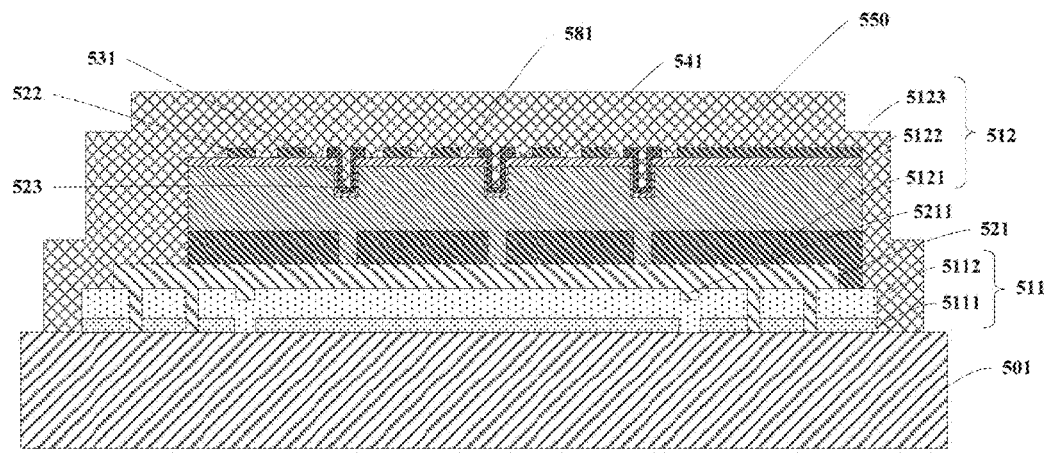
Figure 5L:
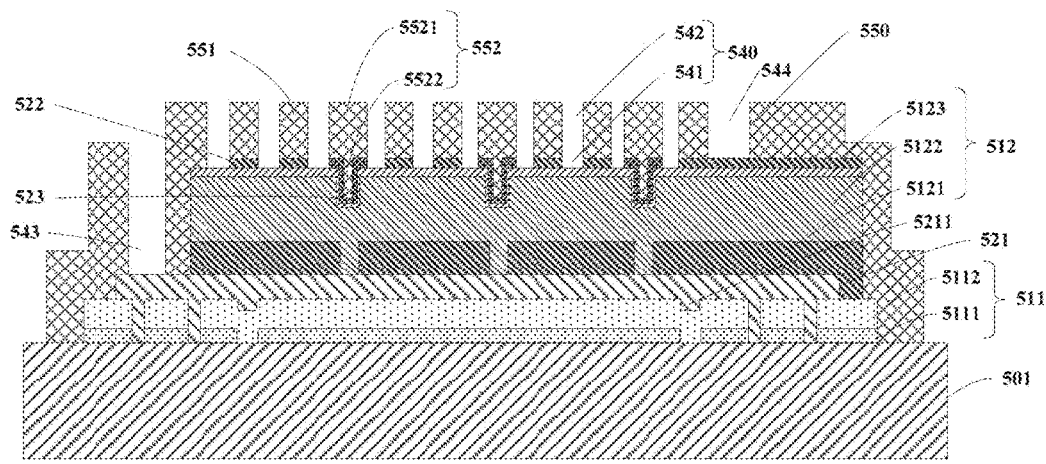
Figure 5M:
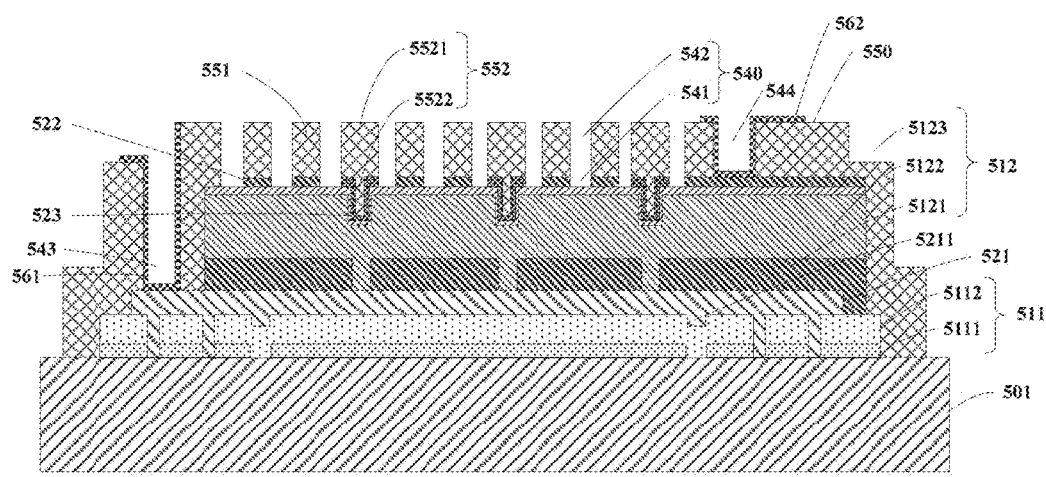
Figure 5N:
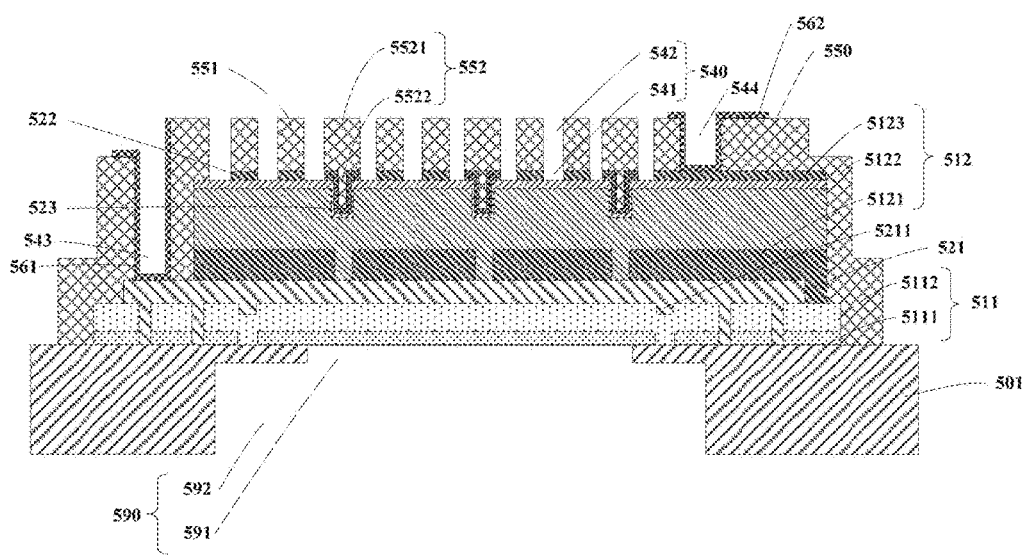
Figure 5O:
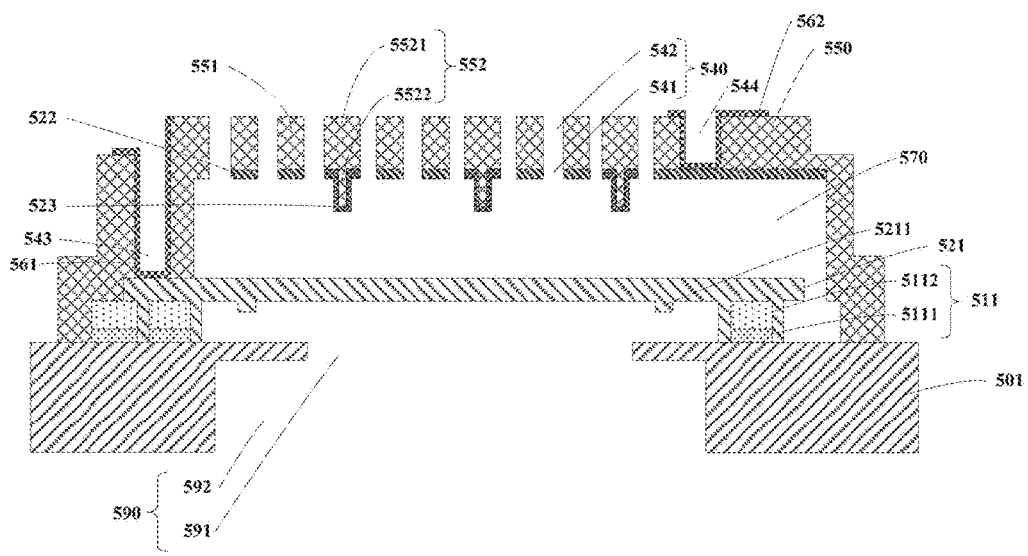

FIGS. 5A to 5O are cross-sectional views illustrating intermediate stages of a microphone in a manufacturing method according to another embodiment of the present invention. The manufacturing process of a microphone according to another embodiment of the present invention will be described in detail below with reference to FIGS. 5A to 5O.

Referring to FIG. 5A, a substrate 501 is provided. Substrate 501 may be a silicon substrate. A first portion 5111 of a first sacrificial layer (e.g., silicon dioxide) is formed (e.g., using a deposition process) on substrate 501. First portion 5111 of the first sacrificial layer is then patterned (e.g., using a photolithography and etch process) to form a second recess 532 that exposes a surface of the substrate.

Next, referring to FIG. 5B, a second portion 5112 of the first sacrificial layer is formed (e.g., using a deposition process) on first portion 5111. A portion of second portion 5112 of the sacrificial layer is formed in second recess 532 such that the second portion 5112 of the first sacrificial layer is formed having a third recess 533. In this step, first portion 5111 and second portion 5112 collectively form a first sacrificial layer 511.

Next, referring to FIG. 5C, first portion 5111 and second portion 5112 of the first sacrificial layer are etched to form a plurality of fourth recesses 534 that are spaced apart from each other and expose a surface of the substrate.

Next, referring to FIG. 5D, a patterned first electrode plate layer 521 is formed (e.g., using a deposition process) on the second portion 5112 of the first sacrificial layer. In this step, a portion of first electrode plate layer 521 is formed in third recess 533 such that the first electrode plate layer has a protrusion portion 5211 protruding toward the substrate. Further, in this step, a portion of first electrode plate layer 521 is formed in fourth recesses 534 to separate certain portions of first sacrificial layer 511 from the remaining portion of the first sacrificial layer.

Next, referring to FIG. 5E, a third portion 5121 of a second sacrificial layer (e.g., silicon dioxide) is formed (e.g., using a deposition process) on first electrode plate layer 521.

Next, referring to FIG. 5F, third portion 5121 of the second sacrificial layer is patterned (e.g., using a photolithography and etch process) to form a fifth recess 535 that exposes a surface of the first electrode plate layer.

Next, referring to FIG. 5G, a fourth portion 5122 of the second sacrificial layer (e.g., silicon dioxide) is formed (e.g., using a deposition process) on third portion 5121 of the second sacrificial layer. A portion of fourth portion 5122 is formed in fifth recess 535 such that fourth portion 5122 of the second sacrificial layer includes a first recess 531. In one embodiment, fourth portion 5122 may be patterned (e.g., using a photolithography and etch process) to expose a portion of first electrode plate layer 521 and a portion of substrate 501. In this step, third portion 5121 and forth portion 5122 of the second sacrificial layer collectively form a second sacrificial layer 512.

Next, referring to FIG. 5H, a fifth portion (e.g., silicon dioxide) 5123 of the second sacrificial layer is formed on fourth portion 5122 of the second sacrificial layer. A portion of fifth portion 5123 of the second sacrificial layer is formed on the bottom and sidewalls of first recess 531. Fifth portion 5123 of the second sacrificial layer may have a thickness of several thousand angstroms, e.g., 3000 angstroms. In this step, third portion 5121, fourth portion 5122, and fifth portion 5123 of the second sacrificial layer collectively form second sacrificial layer 512. Fifth portion 5123 of the second sacrificial layer can reduce damage to fourth portion 5122 of the second sacrificial layer in subsequent etching processes and also reduce damage to the substrate in subsequent etching processes.

Next, referring to FIG. 5I, a patterned second electrode plate layer 522 is formed on fifth portion 5123 of the second sacrificial layer, and a conductive material layer 523 is formed in first recess 531. Conductive material layer 523 and second electrode plate layer 522 are spaced apart from each other. In this step, second electrode plate layer 522 is formed having a first through hole 541 extending through the second electrode plate layer. First through hole 541 exposes a portion of the upper surface of fifth portion 5123 of the second sacrificial layer.

Next, referring to FIG. 5J, a spacer 581 is formed on side surfaces of patterned second electrode plate layer 522. In this step, spacer 581 may also be formed on side surfaces of the semiconductor material layer. In the embodiment of the present invention, a portion of fifth portion 5123 of the second sacrificial layer on substrate 501, first sacrificial layer 511, first electrode plate layer 521, third portion 5121 and fourth portion 5122 of the second sacrificial layer may also be removed in the formation of the spacer.

Next, referring to FIG. 5K, a support structure layer 550 is formed, e.g., using a deposition process, on the structure shown in FIG. 5J.

Next, referring to FIG. 5L, support structure layer 550 is etched to form a patterned support structure layer. Support structure layer 550 may include an electrode attachment portion 551 operable to attach second electrode plate layer 522, and a stopper 552 operable to block first electrode layer 521 from coming into contact with second electrode plate layer 522. Stopper 552 may include a first portion 5521 connected to (not shown) electrode attachment portion 551 and a second portion 5522 disposed below first portion 5521. Support structure layer 550 may be formed with a second through hole 542 extending through the support structure layer and aligned with first through hole 541. First through hole 541 and second through hole 542 collectively form a through hole 540 extending through second electrode plate layer 522, support structure layer 550, and to second sacrificial layer 512. Support structure layer 550 may also be formed with a third through hole 543 exposing a surface of first electrode plate layer 521 and a fourth through hole 544 exposing a surface of second electrode layer 522.

Next, referring to FIG. 5M, a first connection member 561 is formed in third through hole 543 and in contact with first electrode plate layer 521, and a second connection member 564 is formed in fourth through hole 544 and in contact with second electrode plate layer 522.

Next, referring to FIG. 5N, substrate 501 is etched to form an opening 590. Opening 590 exposes a portion of the lower surface of first portion 5111 of the first sacrificial layer. Opening 590 may include a first portion 591 in the vicinity of first electrode plate layer 521 and a second portion 592 below first portion 591. In one embodiment, the width of first portion 591 of opening 590 is smaller than the width of second portion 592 of opening 590.

Next, referring to FIG. 5O, second sacrificial layer 512 is removed, e.g., using a BOE process, to form a cavity 570 that is delineated by support structure layer 550, first electrode plate layer 521, and substrate 501. A portion of first sacrificial layer 512 is also removed. In one embodiment, the portion of first sacrificial layer 512 is removed concurrently with the removal of second sacrificial layer 512.

A method for manufacturing a microphone according to another embodiment of the present invention is thus provided.

Referring to FIG. 5O, a microphone according to the above-described method may include a substrate 501, a first electrode plate layer 521, a second electrode plate layer 522, a support structure layer 550, a conductive material layer 523, a first connection member 561, and a second connection member 562. The layers and structures contained therein are the same or similar as those of the structure shown in FIG. 3G, e.g., substrate 301, first electrode plate layer 321, second electrode plate layer 322, support structure layer 350, conductive material layer 323, first connection member 361, and second connection member 362, respectively. The description of these same or similar layers and structures will not be repeated herein for the sake of brevity. Only the differences between the structures of FIGS. 3G and 5O will be described below.

In one embodiment, referring to FIG. 5O, first electrode plate layer 521 is formed having a protrusion portion 5211 protruding toward substrate 501. The protrusion portion can prevent the first electrode plate layer from coming into contact with the substrate when the first electrode plate layer vibrates.

In one embodiment, referring still to FIG. 5O, first electrode plate layer 521 is formed having a portion in contact with substrate 501. This portion of first electrode plate layer 521 isolates a portion of first sacrificial layer 511 such that this portion of first sacrificial layer 511 can be retained in the step of removing a portion of the first sacrificial layer.

In one embodiment, referring still to FIG. 5O, an opening 590 is formed extending through the substrate. Opening 590 may include a first portion 591 in the vicinity of first electrode plate layer 521 and a second portion 592 disposed below first opening 591. In one embodiment, first opening 591 has a width smaller than the width of second opening 592.

In the embodiment of the present invention, the stopper prevents the second electrode plate layer from coming into contact with the first electrode plate layer. The conductive material layer is formed on the stopper. Based on the principle of collecting charge and discharging charge using the tip of the conductive material layer, the charge on the electrode plate layer of a microphone capacitor can be reduced, the leakage current of the microphone is reduced, thereby improving the device and yield of the semiconductor device.

Further, the protrusion portion of the first electrode plate layer can prevent adhesion of the first electrode plate layer to the substrate during the vibration of the first electrode plate layer to protect the first electrode plate layer.

Additionally, embodiments of the present invention do not increase the required number of masks in relation to conventional process techniques, so that the present invention is well suited for mass production of semiconductor devices.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A microphone comprising:
    a substrate;
    an opening extending through the substrate;
    a first electrode plate layer on the opening and having a first protrusion portion in direct contact with the substrate;
    a second electrode plate layer spaced apart from the first electrode plate layer;
    a support structure layer on the substrate including an electrode attachment portion operable to attach the second electrode plate layer and a stopper operable to block contact between the first electrode plate layer and the second electrode plate layer;
    a cavity delineated by the support structure layer, the first electrode plate layer, and the substrate; and
    a conductive material layer on the support structure layer and spaced apart from the second electrode plate layer.

2. The microphone of claim 1, wherein the conductive material layer comprises polysilicon, gold, or platinum.

3. The microphone of claim 1, wherein the stopper comprises a first portion connected to the electrode attachment portion and a second portion disposed below the first portion and protruding from the second electrode plate layer, the conductive material layer being on the second portion of the stopper.

4. The microphone of claim 3, wherein the conductive material layer is disposed on a lower surface of the first portion of the stopper.

5. The microphone of claim 3, wherein the second portion of the stopper has a width smaller than a width of the first portion of the stopper.

6. The microphone of claim 5, wherein the width of the first portion of the stopper is in a range between 2 μm and 4 μm, and the width of the second portion of the stopper is in a range between 1 μm and 2 μm.

7. The microphone of claim 1, wherein the second electrode plate layer is disposed on a surface of the electrode attachment portion facing the first electrode plate layer.

8. The microphone of claim 1, further comprising:
    a first through hole extending through the second electrode plate layer;
    a second through hole extending through the support structure layer and aligned with the first through hole, the first and second through holes collectively forming a through hole extending through the second electrode plate layer and the support structure layer to the cavity.

9. The microphone of claim 1, wherein:
    the substrate comprises silicon;
    the first electrode plate layer and the second electrode plate layer each comprise polysilicon;
    the support structure layer comprises silicon nitride.

10. The microphone of claim 1, wherein the support structure layer comprises a third through hole exposing a surface of the first electrode plate layer and a fourth through hole exposing a surface of the second electrode plate layer.

11. The microphone of claim 10, further comprising:
    a first connection member in the third through hole and in contact with the first electrode plate layer; and
    a second connection member in the fourth through hole and in contact with the second electrode plate layer.

12. The microphone of claim 1, wherein the first electrode plate layer further comprises a second protrusion portion protruding toward the substrate and not in contact with the substrate, the second protrusion portion being configured to prevent the first electrode plate layer from coming into contact with the substrate during a vibration of the first electrode plate layer.

13. A method for manufacturing a microphone, comprising:
    providing a semiconductor structure including a substrate, a first sacrificial layer on the substrate, a first electrode plate layer on the first sacrificial layer and having a protrusion portion in direct contact with the substrate, a second sacrificial layer on the first electrode plate layer, a first recess in the second sacrificial layer;
    forming a patterned second electrode plate layer on the second sacrificial layer;
    forming a conductive material layer in the first recess, the conductive material layer and the second electrode plate layer being spaced apart from each other;
    forming a patterned support structure layer on the semiconductor structure, the support structure layer comprising an electrode attachment portion operable to attach the second electrode plate layer and a stopper operable to block contact between the first electrode plate layer and the second electrode plate layer, the stopper having a portion formed on the conductive material layer;
    etching the substrate to form an opening exposing a portion of a lower surface of the first sacrificial layer;

removing the second sacrificial layer to formed a cavity, the cavity being delineated by the support structure layer and the first electrode plate layer.

14. The method of claim 13, wherein the conductive material layer comprises polysilicon, gold, or platinum.

15. The method of claim 13, wherein the stopper comprises a first portion connected to the electrode attachment portion and a second portion disposed below the first portion and protruding from the second electrode plate layer, the conductive material layer being on the second portion of the stopper.

16. The method of claim 15, wherein the conductive material layer is disposed on a lower surface of the first portion of the stopper.

17. The method of claim 15, wherein the second portion of the stopper has a width smaller than a width of the first portion of the stopper.

18. The method of claim 17, wherein the width of the first portion of the stopper is in a range between 2 μm and 4 μm, and the width of the second portion of the stopper is in a range between 1 μm and 2 μm.

19. The method of claim 13, wherein the second electrode plate layer and the conductive material layer comprise a same material, and forming the second electrode plate layer and the conductive material layer comprises:

forming an electrically conductive cover layer on the second sacrificial layer, the cover layer having a portion formed in the first recess;

patterning the cover layer, wherein a portion of the covering layer on the second sacrificial layer is operable as the second electrode plate layer, the portion of the cover layer formed in the first recess is operable as the conductive material layer, and the conductive material layer and the second electrode plate layer are spaced apart from each other.

20. The method of claim 13, wherein:

forming the patterned second electrode plate layer comprises forming a first through hole extending through the second electrode plate layer;

forming the support structure layer comprises forming a second through hole extending through the support structure layer and aligned with the first through hole, the first and second through holes collectively forming a through hole extending through the second electrode plate layer and the support structure layer to the cavity.

\* \* \* \* \*